United States Patent [19]

Ham

[11] 3,981,439
[45] Sept. 21, 1976

[54] UNIDIRECTIONAL DRIVE ASSEMBLY FOR A GEAR DRIVEN METER REGISTER

[75] Inventor: Donald M. Ham, Rochester, N.H.

[73] Assignee: General Electric Company, Schenectady, N.Y.

[22] Filed: Sept. 4, 1975

[21] Appl. No.: 610,486

[52] U.S. Cl. ................... 235/91 R; 235/144 MA; 324/103 R
[51] Int. Cl.² ......................................... G06M 1/00
[58] Field of Search ............... 235/1 C, 91 R, 95 R, 235/96, 144 MA; 324/103 R

[56] References Cited
UNITED STATES PATENTS
3,908,166   9/1975   Shackford ................. 324/103 R Primary Examiner—Stanley J. Witkowski
Attorney, Agent, or Firm—Vale P. Myles

[57] ABSTRACT

A unidirectional drive assembly that is operable to rotate an indicating pointer in an up-scale direction responsive to rotation of an input drive gear wheel in either a forward or a reverse direction. The assembly is characterized by having an idler gear shift assembly coaxially mounted in nesting relationship with a ratio gear assembly in a compact arrangement between supporting members of a frame assembly, in combination with a register indicator gear assembly and an idler gear rotatably mounted in continuous meshing engagement with a gear in the register indicator gear assembly. The idler gear shift assembly is operable to selectively move either a first or a second idler gear into meshing engagement respectively with either the gear on the register indicator gear assembly or with the idler gear continuously meshed therewith. The idler shift assembly performs its shifting operation responsive to reversal of the direction of rotation of the ratio gear assembly, thereby to cause the register indicator gear assembly to drive a register indicator in an up-scale direction regardless of the direction of rotation of the ratio gear assembly which is directly responsive to the direction of rotation of an input gear wheel driven by a meter gear train on which the unidirectional drive assembly is mounted.

14 Claims, 5 Drawing Figures

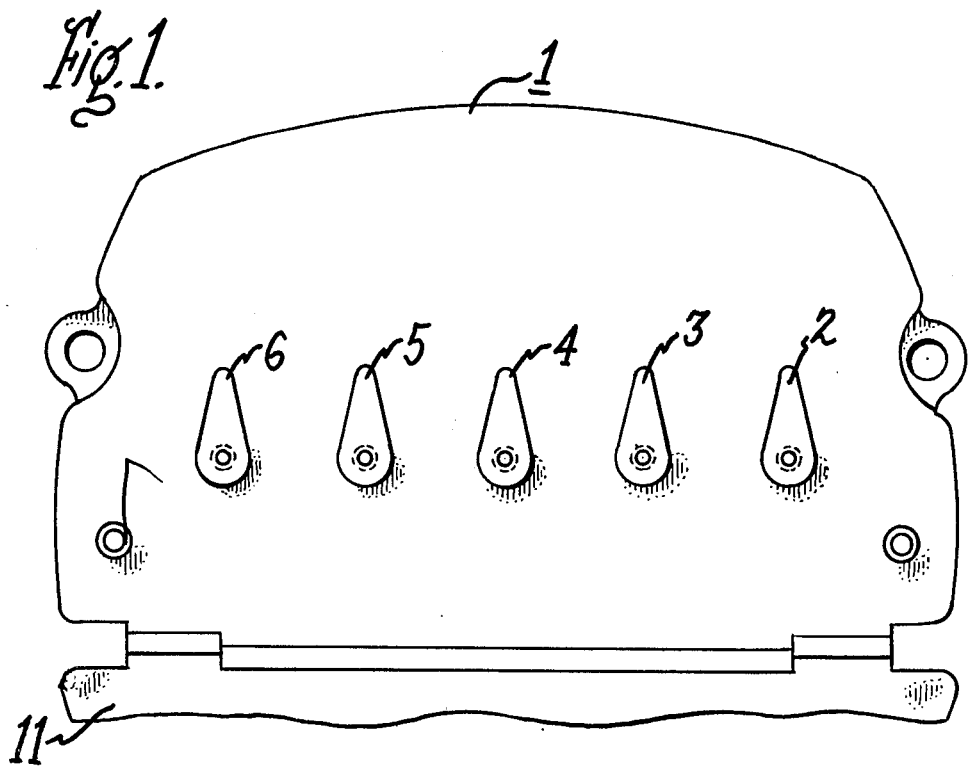

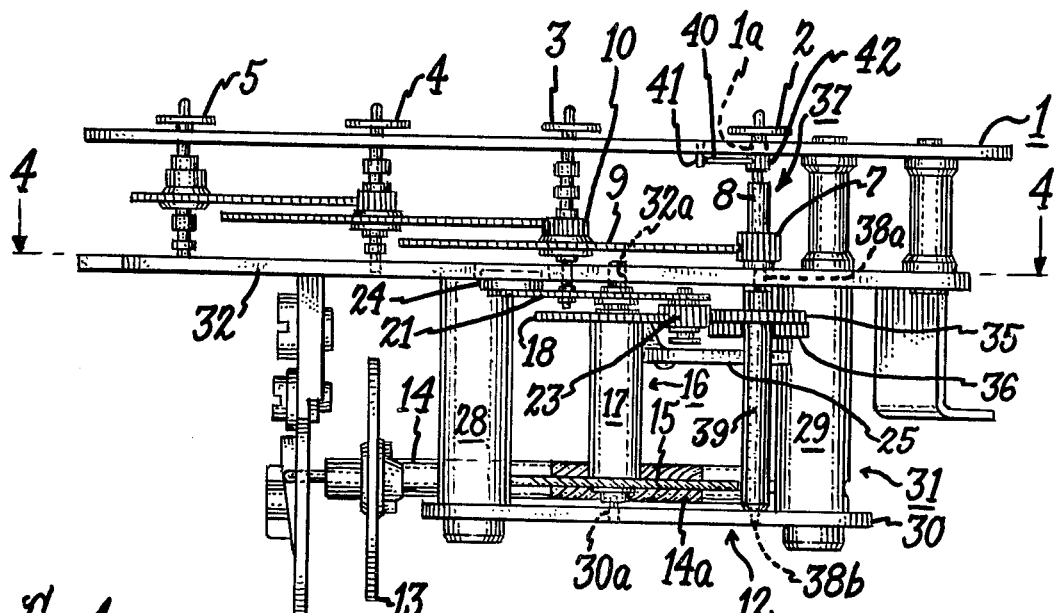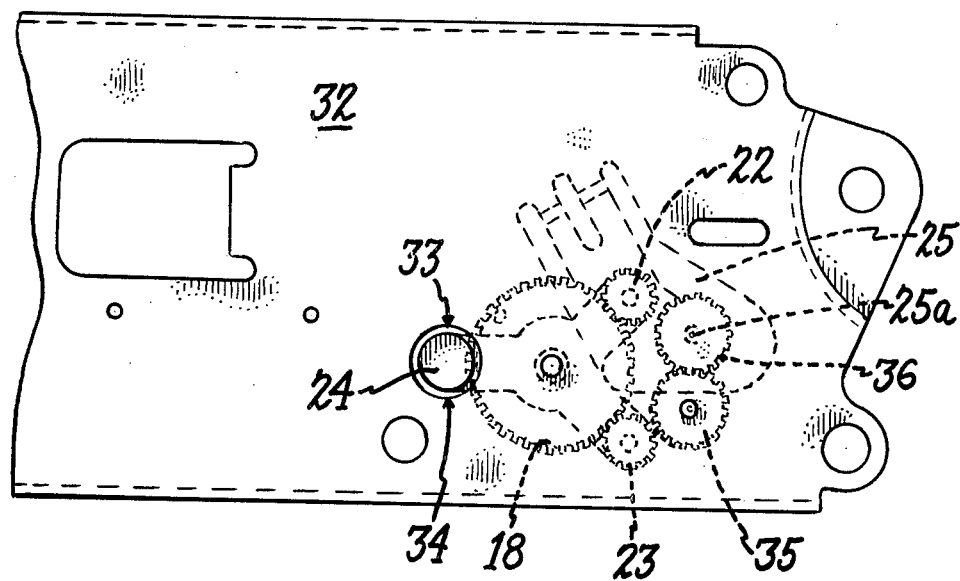

UNIDIRECTIONAL DRIVE ASSEMBLY FOR A GEAR DRIVEN METER REGISTER

BACKGROUND OF THE INVENTION

The invention relates to a unidirectional drive assembly of the type that is operable to drive an output gear in a single direction of rotation responsive to rotation of an input drive gear in either a forward or a reverse direction and, more particularly, the invention relates to such a unidirectional drive assembly that is well suited for use in driving a watthour meter register which must combine the features of compact assembly, reliable operation, and highly accurate throughput with low manufacturing cost.

The use of various types of unidirectional registers to record power measured by electric watthour meters has been a common practice for many years. Such registers were initially developed to prevent misuse of the meters that might cause them to record an improperly low rate of power consumption. As is generally well-known, a conventional watthour meter of the induction type may be made to rotate in a reverse direction simply by reversing the potential applied to the meter. For example, if a conventional watthour meter is removed from its socket and simply inverted then re-inserted into the socket, the meter will rotate in a reverse direction and cause the power indicated on its register to be reduced. In order to prevent such cases of meter misuse, unidirectional registers were developed that operate to cause the meter register indicators to rotate in an up-scale direction responsive to either a forward or reverse direction of rotation of the meter register drive gear.

Although unidirectional registers have become relatively common, they typically are still relatively complex assemblies that are subject to various shortcomings. For example, they tend to introduce inaccuracies into the registered output due to lags in the shift mechanisms employed. Moreover, their complex nature results in undesired manufacturing costs as well as tending to penalize the meter system by requiring undesirably large amounts of power to drive such mechanisms. In addition, such prior art systems have characteristically required a significant portion of the space available within a standard meter housing in order to accommodate their complex gear trains. In such an environment it is desirable to simplify assemblies whenever feasible in order to conserve space.

It is also virtually imperative that a unidirectional register be maintenance free and, more specifically, such registers should not be subject to jamming or locking during either the performance of their shifting functions or during normal indicator driving operation. Two common causes of such locking in prior art unidirectional registers has been found to be associated with both gear topping during a register shifting operation in response to a reversal of the input drive gear, and to gear bottoming within the shifting gear train after a reversal in direction has occurred. Such shortcomings have, of course, been recognized heretofore and various precision adjustment means are frequently provided to avoid failures or jamming due to gear bottoming or topping, but in known prior art unidirectional register assemblies such mechanisms normally are time consuming to adjust and tend to be the source of further maintenance problems and meter register inaccuracy problems during normal operation thereof.

OBJECTS OF THE INVENTION

It would, of course, be desirable to provide a unidirectional drive assembly for a gear driven meter register that would overcome the above-noted shortcomings of prior art unidirectional register assemblies. It is a primary objective of the present invention to provide such a unidirectional drive assembly.

Another object of the invention is to provide a unidirectional drive assembly that incorporates means to prevent the assembly from being jammed or locked by gear topping or bottoming during either a shifting operation or normal indicator driving operation of the register.

A further object of the invention is to provide a unidirectional drive assembly that includes an idler gear shift assembly that is mounted in rotatable nesting relationship with a ratio gear assembly to fit compactly between supporting members of a frame assembly that is suitable for mounting within the housing of a conventional watthour meter.

Yet another object of the invention is to provide a unidirectional drive assembly with a gear shifting mechanism that effectively minimizes loss of power registration due to non-rotation of a register indicator during a shifting operation responsive to reversal of a meter register input drive gear.

Still another object of the invention is to provide a unidirectional register that imposes a relatively small mechanical loading on a meter to which the register is coupled and to impose a constant loading on the meter irrespective of the direction of rotation of the register input drive means.

A still further object of the invention is to provide a unidirectional drive assembly that is mechanically balanced so that it does not cause unbalanced static loading to be applied to the register gear drive train of a meter with which it is assembled.

Yet another object of the invention is to provide a unidirectional drive assembly for a meter register in combination with a mechanical pawl device that prevents the introduction of backlash-inducing slack in the drive assembly gear train due to attempts to rotate the indicator dial of the register in a reverse direction.

Additional objects and advantages of the invention will become apparent from the description that follows.

SUMMARY OF THE INVENTION

In one preferred form of the invention, a unidirectional drive assembly for a gear driven meter register is provided with an idler gear shift assembly coaxially mounted in nesting, rotatable relationship with a ratio gear assembly, and both gear assemblies are rotatably mounted between supporting members of a register frame assembly. A register indicator gear connected in driving relationship to an indicator pointer is rotatably mounted in continuous meshing engagement with an idler gear and both the register indicator gear and said idler gear are rotatably mounted on the register frame adjacent to the idler gear shift assembly. The idler gear shift assembly is pivotal in response to rotation in a forward direction of a meter register input drive gear to cause the idler gear shift assembly to be effective (by suitably shifting it) to move a first idler gear into meshing engagement with the register indicator gear. The shift assembly is further effective to move a second idler gear into meshing engagement with the idler gear continuously meshed with the register indicator gear responsive to reversal of the direction of the meter register input drive gear. The first and second idler gears on the idler gear shift assembly are continuously meshed with a ratio gear mounted on the ratio gear assembly and the ratio gear is coupled in driving relationship with a meter register drive gear so that the ratio gear reverses its direction of rotation responsive to reversal in the direction of rotation of the meter register drive gear. In one alternative embodiment of the invention a pivotal pawl is mounted on the register frame assembly to slidably engage a gear driven by the register indicator pointer shaft, thereby to allow only forward rotation of the indicator shaft.

BRIEF DESCRIPTION OF THE DRAWING

FIG. 1 is a front plan view of a unidirectional meter register shown mounted on a fragment of a conventional watthour meter face plate assembly. The unidirectional register dial pointers illustrated are coupled by a conventional drive train to a unidirectional drive assembly constructed pursuant to the present invention.

FIG. 2 is a bottom elevation view of the register shown in FIG. 1 illustrating the unidirectional drive assembly and pawl mechanism of the present invention, in association with a conventional watthour meter register input drive gear mounted in driving relationship with the unidirectional meter register drive assembly.

FIG. 4 is a fragmentary top plan view of the front side of the intermediate frame plate of the frame assembly used in the unidirectional drive assembly illustrated in FIG. 2, taken along the plane 4—4 shown therein, and shown with respect to an illustration in phantom of a register indicator drive gear assembly and idler gear continuously meshed therewith, and also shown with respect to the gears of the idler gear shift assembly (of FIG. 3a), and a gear of the ratio gear assembly (of FIG. 3b) with which the gears of the idler gear shift assembly are continuously meshed.

DESCRIPTION OF A PREFERRED EMBODIMENT

Figure 3A:
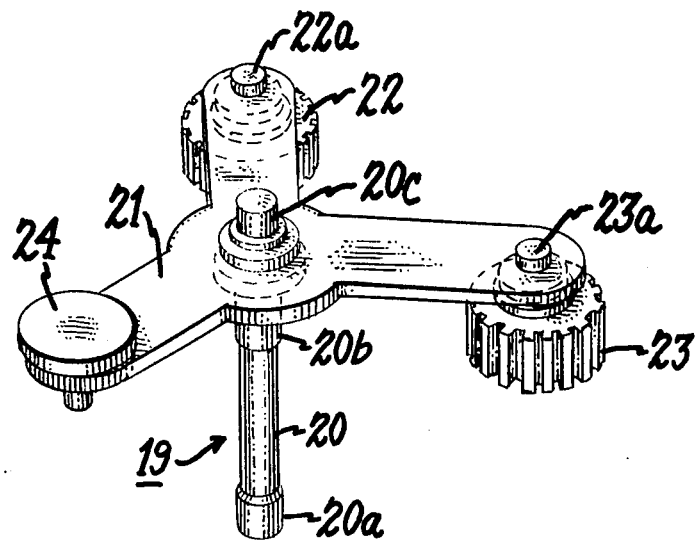
FIG. 3a is a fragmentary, enlarged isometric view of an idler gear shift assembly for the unidirectional drive assembly illustrated in FIG. 2.

Referring now to FIG. 1, it will be seen that there is shown a relatively conventional watthour meter register face plate 1, having five rotatably mounted indicator pointer dials 2, 3, 4, 5 and 6 that are coupled together in driving relationship by a conventional gear train as shown in FIG. 2. The gear train comprises a first pinion gear 7 fixed to shaft 8 on which the first pointer 2 is staked in a conventional manner. The shaft 8 is journaled to rotate in suitable apertures 1a in face plate 1 and 25a in tang 25 stamped from plate 32 (see FIGS. 2 and 4). The pinion 7 drives wheel gear 9 continuously meshed therewith, and in similar manner rotation of gear 9 drives a second pinion gear 10 on the rotatably mounted shaft supporting indiator pointer 3, etc., through the remaining illustrated gears to the indicating pointer 6, as is well-known in the watthour meter art. The register face place 1 is shown mounted above a portion of a conventional watthour meter front plate 11 (seen in FIG. 1).

In addition to the indicator dials and indicator dial driving gear train shown in FIG. 2, the unidirectional drive assembly 12 of the present invention is shown mounted in operating relationship with respect to a meter register input drive gear 13 that, it will be understood, is adapted to mesh with a suitable watthour meter gear that is arranged to be coupled in driven relationship with a rotatable induction disc of a watthour meter in any well-known manner. In this form of the invention, the meter register drive gear 13 is mounted in fixed relationship on a rotatably mounted worm gear shaft 14 having a worm gear section 14a that is disposed in continuous meshing engagement with an input wheel gear 15 of a ratio gear shaft assembly 16 that is constructed according to the teaching of the present invention. The ratio gear shaft assembly 16 is shown in enlarged detail in FIG. 3b of the drawing and, as will be seen by reference to FIG. 3b, it consists of the input gear wheel 15 mounted on a hollow shaft 17 having wall means defining a passageway 17a, shown in phantom, along the center line thereof. The wheel gear 15 is mounted on the hollow shaft adjacent one end thereof by being staked together in a well-known manner. The rataio gear assembly as completed by ratio gear 18 that is mounted on the hollow shaft 17 adjacent the other end thereof and in fixed relationship therewith by being staked to it in a conventional manner.

Figure 3B:
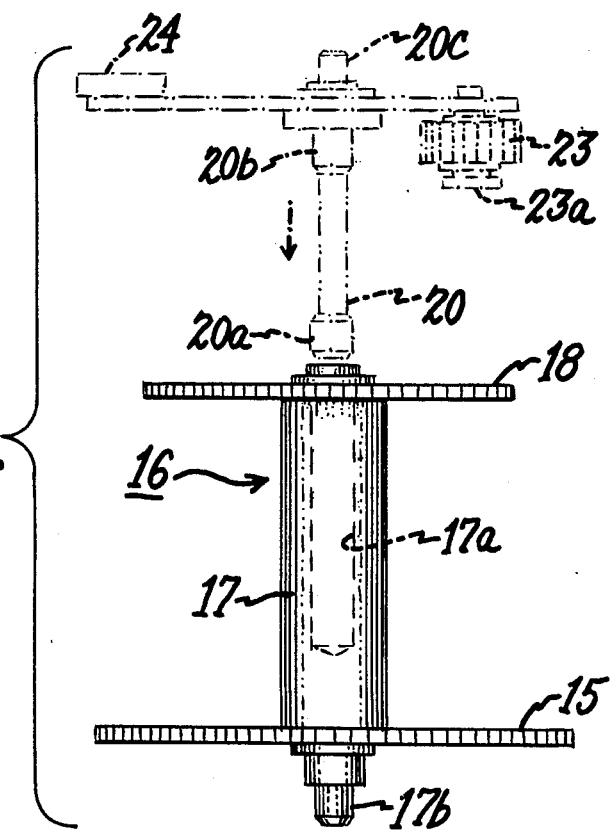
FIG. 3b is an enlarged, side elevation view of a ratio gear assembly for the unidirectional drive assembly illustrated in FIG. 2, shown with respect to the idler gear shift assembly of FIG. 2, depicted in phantom in alignment for insertion into nested relationship therewith.

Pursuant to an important characteristic of the invention, an idler gear shift assembly 19, shown both in FIG. 2 and in enlarged detail in FIG. 3a, is designed to be nested within the hollow shaft 17 of the ratio gear shaft assembly 16, as shown in FIG. 2. Before describing this nesting relationship in detail, along with the advantages thereof, reference can be made to FIG. 3a to understand the structure of the idler shift assembly 19. As shown in FIG. 3a, the idler shift assembly 19 consists of a rotatable soslid shaft 20 having enlarged cylindrically shaped bearing portions or surfaces 20a and 20b disposed adjacent either end thereof. A suitably formed shift plate 21 is mounted on the solid shaft 20 adjacent one end thereof and in fixed perpendicular relationship therewith by being staked to it. First and second idler gears 22 and 23 are rotatably mounted on the shift plate 21 by being mounted for free rotation on axles 22a and 23a respectively which are staked into the plate 21 and project from one side thereof. The axles 22a and 23a are arranged to position the pinion idler gears 22 and 23 at points on the shift plate 21 spaced an equal distance from the axis of rotation of the solid shaft 20, according to the invention. A stop member 24 is mounted in fixed position on the shift plate 21 at a point spaced from the first and second idler gears by a predetermined distance that is determined by the counterbalancing effect desired from the stop member 24. As shown in FIG. 3a, the stop member 24 may be secured to the plate 21 by being staked or otherwise suitably mounted thereon. In the preferred form of the invention, the stop member 24 is located on the other side of the plate 21 from the idler gears 22 and 23 thereby to help statically balance the idler gears (with stop member 24) about a plane through the plate member 21, which in its preferred form, is generally Y-shaped and the idler gears 22 and 23 are mounted respectively adjacent the outer ends of the forked legs of the Y-shaped shift plate 21 while the stop member 24 is mounted adjacent the outer end of the trunk leg thereof. Of course, other suitable configurations for the shift plate 21 may be used in alternative embodiments of the invention. It will be noted that in addition to balancing the idler gears 22 and 23 relative to a plane through the legs of the Y-shaped shift plate 21, the stop member 24 serves to counterbalance the idler gears 22 and 23 with respect to the axis of rotation of the solid shaft 20, as is desired to prevent non-uniform (or a twisting,) loading of the ratio gear 18 during the operation of the unidirectional drive assembly of the invention. The radial spacing of stop member 24, as well as its weight, can be adjusted to achieve the desired balancing effect relative to the axis of rotation of plate 21.

An important feature of the present invention is the unique nesting relationship of the assembled ratio gear shaft assembly 16 and the idler gear shift assembly 19, as shown in FIG. 2. To describe this relationship in detail, reference is first made to FIGS. 3a and 3b which illustrate the idler shift assembly positioned in aligned relationship above the ratio gear shaft assembly, rather than in their assembled, nested relationship. This orientation is used to depict the relative dimensions of the bearing surface 20a and 20b on the solid shaft 20, which surfaces are adapted to rotate within the passageway 17a of hollow shaft 17, in engagement therewith, relative to the substantially smaller diameters of the respective ends 17b of hollow shaft 17 and 20c of solid shaft 20. The shaft end 17b is rotatably mounted within a suitable bearing aperture 30a in a backplate 30 (see FIG. 2) of a meter register frame assembly 31. Likewise, the reduced diameter cylindrical bearing surface 20c of the solid shaft 20 is rotatably mounted in a cylindrical aperture 32a formed in a front plate 32 of the frame assembly 31, as shown in FIG. 2 of the drawing. The front plate 32 is held in fixed relationship and spaced from the back plate 30 by a suitable holding means such as the struts 28 and 29 that are staked to the two plates 30 and 32, as shown in FIG. 2.

So far as the operation of the invention is concerned, the relationship between the diameters of the bearing surfaces (20c and 17b) on the respective outer ends of the solid shaft 20 and the hollow shaft 17, relative to the bearing surfaces 20a and 20b on the solid shaft 20, is such that the diameters of the surfaces 17b and 20c are in the range of three-quarters to one-half the size of the diameters of the bearing surfaces 20a and 20b of the solid shaft 20. More specifically, from a functional standpoint, according to the present invention, the frictional forces between the outer end bearing 17b of hollow shaft 17 combined with the frictional forces of the outer end bearing 20c on solid shaft 20 are designed to be smaller than the frictional forces existing between the sides of the passageway 17 in hollow shaft 17 and the bearing surfaces 20a and 20b on solid shaft 20, combined with the frictional forces due to the rotation of the first and second idler gears 22 and 23 when the shift plate 21 is rotated to effect a shifting operation in a manner that will be described more fully below. Thus, the fixed shaft 20 is caused to rotate with the hollow shaft 17 thereby causing the shift plate 21 to rotate with the ratio gear assembly 16 until further movement of the shift plate 21 is arrested either by the stop member 24 coming into engagement with one of two limit stops 33, 34 (as best seen in FIG. 4), or by said first or second idler gears 22, 23 coming into engagement respectively with either a rotatably mounted register indicator drive gear 36 or with a third idler gear 35 (see FIG. 4), both of which are rotatably mounted on separate shafts and supported between the front and back plates 30 and 32 of frame assembly 31.

The indicator drive gear 36 is part of an indicator gear assembly 37 (see FIG. 2), comprising the indicator drive gear 36 that is mounted for rotation relative to the frame assembly 31 and coupled to rotate a meter register indicator, in this case dial pointer 2, relative to the frame assembly 31 and register dial or face plate 1 (see FIG. 1), responsive to the rotation of the indicator drive gear 36, in combination with a shaft 8 on which the drive gear 36 is positioned adjacent to the first idler gear 22 of the idler shift assembly 19 for interruptable meshing engagement therewith. Additional components of the indicator gear assembly 37 will be described below relative to the pivotal pawl option of the invention.

As mentioned above, the third idler gear 35 is mounted for rotation relative to the frame assembly 31 and is positioned adjacent to the second idler gear 23 for interruptable meshing engagement therewith. The third idler gear 35 is staked on a shaft 39 (see FIG. 2), that is rotatably journaled in suitable apertures 38a and 38b formed respectively in front plate 32 and in back plate 30 of frame assembly 31, opposite the ends of shaft 39.

In accordance with important features of the invention, the orientation of indicator drive gear 36 and third idler gear 35 relative to first idler gear 22 and second idler gear 23, respectively, is such that the first idler gear 22 is positioned in nesting engagement with the indicator drive gear 36 and the second idler gear 23 is spaced a given distance from the third idler gear 35 responsive to the stop member 24 being moved to one end of its predetermined range of angular movement so that it engages the limit stop 33 on plate member 32 (see FIG. 4). In addition, this orientation is such that the first idler gear 22 is spaced a given distance from the indicator drive gear 36 when the second idler gear 23 is positioned in meshing engagement with the third idler gear 35 responsive to the stop member 24 being moved to the other end of said predetermined range of angular movement to abut the limit stop 34 on plate 32.

In the illustrated preferred form of the invention, the limit stops 33 and 34 are defined in plate member 32 by the sides of a suitable circular aperture punched or otherwise formed therein. Of course, in other embodiments of the invention various other suitable means can be used to form equivalently effective limit stops.

As discussed above in explaining the objects of the present invention, it is desirable to limit the spacing between the disengaged first or second idler gears (22, 23) and the indicator drive gear 36 or the third idler gear 35, when the other idler gear (22 or 23) is in meshing engagement to drive the indicator dial 2 in an up-scale direction. Thus, the given distance referred to above as existing between the second and the third idler gear is preferably in the range of 0.002 inch to 0.01 inch when the stop member 24 is moved to one end of the predetermined range of angular movement established by it with the idler shift assembly 19. Likewise, said given distance between the first idler gear 22 and the indicator drive gear 36 is in a similar range when the stop member 24 is moved to the other end of the predetermined range of angular movement of the idler shift assembly 19. In addition to desirably limiting the interval of non-meshing engagement between the first and second idler gears and the indicator drive gear 36 or third idler gear 35, thereby to appropriately limit the amount of non-registration of power consumption during a shifting operation, the aforesaid desired predetermined range of angular movement for the shift assembly 19, relative to the orientation of indicator drive gear 36 and third idler gear 35 is selected, according to the present invention, to effectively prevent gear tooth bottoming between the first and second idler gears (22, 23) and the gears 35 and 36 of the indicator register drive train with which they are, respectively, meshable. It will be understood that such bottoming of these gears might cause the indicator drive assembly 37 to jam or lock or otherwise undesirably load the register drive gear train. Therefore, the predetermined range of angular movement for the pivotal idler shift assembly 19 should be carefully determined by suitably sizing or positioning the stop member 24 relative to the limit stops 33 and 34 so that when the stop member 24 is moved to one end of its predetermined range of angular movement, into abutment with the limit stop 33, the first idler gear 22 will be in optimum meshing engagement with indicator drive gear 36, but will not be able to cause the teeth of idler gear 22 to strike the bottom of the spacing in indicator drive gear 36 between its teeth. Likewise, a similar optimum driving relationship will be made to exist between the second idler gear 23 and the third idler gear 35 so that when the limit stop 24 is moved to the other end of its predetermined range of angular movement into engagement with limit stop 34, tooth bottoming will not occur between the gears 23 and 35.

Of course, it will be understood that the limit stop member 24 is freely movable in the aperture defined by the limit stops 33 and 34 in front plate 32, so that its movement is only retarded by engagement with these limit stops. On the other hand, it will be recognized that in the event of gear topping during a shifting operation of the pivotal idler shift assembly 19, the assembly 19 will continue to rotate relative to the ratio gear assembly 16 to automatically move the topped idler gear out of topping engagement. To illustrate this mode of operation, the shift assembly 19 is shown in FIG. 4 with its first idler gear 22 being moved toward the indicator drive gear 36 but, it will be assumed, with the top of the teeth of idler gear 22 in engagement with the top of the teeth of indicator drive gear 36. Such a topping engagement between these gear teeth will arrest pivotal movement of the shift assembly 19 thereby causing relative rotation between it and the ratio gear 18. Because the ratio gear 18 is in continuous meshing engagement with the first idler gear 22, that relative rotation causes the first idler gear to rotate and drop into meshing engagement with the indicator drive gear 36, thereby automatically clearing the topping engagement, which might otherwise cause locking or jamming of the indicator drive assembly 37.

In addition to the important anti-jamming operation just described, a further desirable operating feature of the present invention is that the first, second and third idler gears (22, 23 and 35) rotate continuously in response to rotation of the ratio gear 18 in either a forward or reverse direction. Thus, it will be noted that this arrangement provides a substantially constant mechanical load on the register drive gear 13 of a meter on which the unidirectional drive assembly of the invention is mounted, regardless of the direction of rotation of the meter register drive gear 13. Of course, such equal loading is important to maintain the accuracy and uniformity of power registration on the indicator dials 2 – 6.

Pursuant to a further feature of the preferred embodiment of the invention, a pivotal pawl 40 is staked to a rotatably mounted axle pin 41 that is suitably journaled in an aperture in register face plate 1, as best seen in FIG. 2. The pawl 40 is arranged to be held by the force of gravity, in sliding engagement with a set of pawl-engaging teeth 42 formed on the dial indicator shaft 8 immediately adjacent to the faceplate member 1 of the register frame assembly 37 on which the pawl 40 is pivotally supported. By thus engaging the teeth of gear 42 of the indicator drive gear assembly 37, or some other gear directly coupled therewith (in an alternative embodiment of the invention, not shown), the pawl 40 is effective to prevent reverse rotation of the indicator drive gear 36 while allowing forward rotation thereof. Although the use of such a pawl is not necessary to insure proper operation of the unidirectional drive assembly of the invention in most applications, it has been found desirable to utilize the pawl 40, or its equivalent, in order to prevent the introduction of backlash-inducing spacing between the respective gears of the indicator drive assembly and the idler shift assembly in applications where there is likely to be an attempt to reverse the direction of rotation of the indicator dial pointer 2.

OPERATION OF THE INVENTION

Although the mode of operation of the preferred embodiment of the invention is probably understandable to those skilled in the art from the description of the structure presented above, the operation will be briefly summarized again. Assuming that the meter register drive gear 13 is being rotated in a forward direction such that the indicator dial pointer 2 is rotated in an up-scale direction, the ratio gear assembly 16 will have pivoted the shift plate 21 of the idler shift assembly 19 until the stop member 24 reaches one end of its predetermined range of angular movement and abuts the limit stop 33. Thus, the first idler gear 22 is positioned in a desired degree of meshing engagement with the indicator drive gear 36 causing it to move the register indicator in an upscale direction. Now, if the meter register gear 13 is reversed to reverse the direction of input wheel gear 15 of the ratio gear assembly 16 the frictional forces between the passageway 17a of hollow shaft 17 and the bearing surfaces 20a and 20b of solid shaft 20 on idler shift assembly 19 cause the shift plate 21 of the idler shift assembly 19 to rotate in a backward direction until the stop member 24 reaches the other end of its predetermined range of angular movement and engages the other limit stop 34. Thus, the second idler gear 23 is positioned in a desired degree of meshing engagement with the third idler gear 35 causing it to rotate the indicator drive gear 36, with which it is in continuous meshing engagement, and again move the register indicator dial pointer 2 in an up-scale direction. Continuous up-scale rotation is effected, despite the reversal, except for the brief interval when the respective meshing engagements of both first idler gear 22 and second idler 23 are interrupted as shift assembly 19 goes through the intermediate position illustrated in FIG. 4.

It will be understood by those skilled in the art that various modifications and alternative arrangements might be made in applying the invention to various systems, thus it is my intent to encompass within the following claims the true spirit and scope of the invention. For example, although the various gears and shafts have been described as being staked together or to their respective frame plates on which they are mounted, other suitable well-known means could be utilized to effect such mounting.

What I claim as new and desire to secure by Letters Patent of the United States is:

1. A unidirectional drive assembly for a gear driven meter register that is adapted for use with a meter having a register drive gear comprising:
   an idler gear shift assembly coaxially mounted in nesting relationship with a ratio gear assembly between supporting members of a frame assembly on which said gear assemblies are rotatably mounted, in combination with a register indicator gear assembly for rotating an indicator, and a third idler gear rotatably mounted in continuous meshing engagement with a gear in said register indicator gear assembly,
   said idler assembly having first and second idler gears rotatably mounted in selectively interruptible engagement, respectively, with said gear on said register indicator gear assembly and with said third idler gear,
   said idler gear shift assembly being operable to move said first idler gear into meshing engagement with said gear on the register indicator gear assembly responsive to rotation of said ratio gear assembly in a forward direction, and being further operable to move said second idler gear into meshing engagement with said third idler gear responsive to rotation of said ratio gear assembly in a reverse direction,
   whereby said indicator register gear is driven in an up-scale direction by said idler gear assembly responsive to rotation of said ratio gear in either direction.

2. A unidirectional drive assembly comprising an input ratio gear rotatably mounted in continuous meshing engagement with first and second idler gears, said first and second idler gears being mounted for free rotation on a shift plate, said shift plate being pivotal in a forward or a reverse direction responsive respectively to rotation of the ratio gear in a forward or a reverse direction, an output drive gear rotatably mounted in continuous meshing engagement with a third idler gear, said output drive gear being mounted adjacent the first idler gear for interruptible meshing engagement therewith, said third idler gear being rotatably mounted adjacent said second idler gear for interruptible meshing engagement therewith, and limit stop means for confirming the pivotal movement of said shift plate to a predetermined range of angular movement, said first idler gear being operable to drive the output drive gear in a forward direction responsive to being positioned in a desired degree of meshing engagement therewith when the shift plate is pivoted to one end of said predetermined range of angular movement by rotation of the input ratio gear in a forward direction, said second idler gear also being operable to drive the output drive gear in a forward direction through its coupling with the third idler gear responsive to the second idler gear being positioned in a desired degree of meshing engagement with the third idler gear when the shift plate is pivoted to the other end of said predetermined range of angular movement by rotation of the input ratio gear in a reverse direction.

3. A unidirectional drive assembly for a gear driven meter register that is adapted for use with a meter having a register drive gear comprising:
   a ratio gear shaft assembly consisting of an input wheel gear mounted on a hollow shaft adjacent one end thereof in fixed relationship therewith, and a ratio gear mounted on the hollow shaft adjacent the other end thereof in fixed relationship therewith,
   an idler shift assembly consisting of a rotatable solid shaft, a shift plate mounted on the solid shaft adjacent one end thereof in fixed relationship therewith, first and second idler gears rotatably mounted on said shift plate at points spaced an equal distance from the axis of rotation of the solid shaft, and a stop member mounted in fixed position on said shift plate at a point spaced from said first and second idler gears,
   a frame assembly comprising a back plate, a front plate, holding means arranged to hold the front plate and back plate apart in a fixed relationship,
   a register indicator gear assembly consisting of an indicator drive gear mounted for rotation relative to said frame assembly and coupled to rotate a meter register indicator relative to said frame assembly responsive to rotation of said indicator drive gear, said indicator drive gear being positioned adjacent the first idler gear of said idler shift assembly for interruptible meshing engagement therewith,
   a third idler gear mounted for rotation relative to said frame assembly and positioned adjacent the second idler gear of said idler assembly for interruptible meshing engagement therewith, said third idler gear being in continuous meshing engagement with said indicator drive gear,
   the solid shaft of said idler shift assembly being nested within the hollow shaft of said ratio gear shaft assembly for rotation relative thereto and with said ratio gear in continuous meshing engagement with said first and second idler gears, said solid shaft and said hollow shaft being mounted for rotation relative to said frame assembly with the stop member of said idler shift assembly positioned between a pair of limit stops arranged respectively in fixed positions on said frame assembly, said limit stops being effective to establish a predetermined range of angular movement for the shift plate of the idler shift assembly thereby to cause the first idler gear to be positioned in meshing engagement with said indicator drive gear and to cause the second idler gear to be spaced a given distance from said third idler gear responsive to the stop member being moved to one end of said predetermined range of angular movement, and to cause the first idler gear to be spaced a given distance from said indicator drive gear and to cause the second idler gear to be positioned in meshing engagement with said third idler gear responsive to the stop member being moved to the other end of said predetermined range of angular movement,
   whereby rotation of the input wheel gear of said ratio gear assembly in a forward direction causes the shift plate of said idler shift assembly to rotate in a forward direction until said stop member reaches one end of said predetermined range of angular movement and engages one of said limit stops thereby positioning the first idler gear in a desired degree of meshing engagement with the indicator drive gear causing it to move the register indicator in an up-scale direction, whereas rotation of the input wheel gear of said ratio gear assembly in a reverse direction causes the shift plate of said idler shift assembly to rotate in a backward direction until said stop member reaches the other end of said predetermined range of angular movement and engages the other of said limit stops thereby positioning the second idler gear in a desired degree of meshing engagement with said third idler gear causing it to rotate the indicator drive gear and move the register indicator in an up-scale direction.

4. A unidirectional drive assembly as defined in claim 3 wherein the frictional forces between the outer end bearing of said hollow shaft and said solid shaft nested therein are smaller than the frictional forces between the hollow shaft and the bearing surfaces between it and the solid shaft combined with the frictional forces of said first and second idler gears, whereby the fixed shaft is caused to rotate with the hollow shaft until its further movement is arrested either by the stop member coming into engagement with one of said limit stops or by said first or second idler gears coming into engagement, respectively, with the indicator drive gear or said third idler gear.

5. A unidirectional drive assembly as defined in claim 3 wherein said given distance between the second idler gear and the third idler gear is in the range of 0.002 inch to 0.01 inch when the stop member is moved to said one end of said predetermined range of angular movement, and said given distance between the first idler gear and the indicator drive gear is in a similar range when the stop member is moved to said other end of the predetermined range of angular movement.

6. A unidirectional drive assembly as defined in claim 3 wherein said desired degrees of meshing engagement between the gears interruptibly meshable with the first and second idler gears, respectively, is effective to prevent gear tooth bottoming between said meshing gears when said stop member is positioned at either end of said predetermined range of angular movement.

7. A unidirectional drive assembly as defined in claim 3 wherein said idler shift assembly shift plate comprises a Y-shaped plate, and the first and second idler gears are mounted, respectively, adjacent the outer ends of the forked legs of the Y-shaped plate while the stop member is mounted on the trunk leg of the Y-shaped plate.

8. A unidirectional drive assembly as defined in claim 7 wherein said first and second idler gears are rotatably supported, respectively, on axles that are staked respectively to said forked legs and project outward from one side of the Y-shaped plate, said stop member being mounted to extend outward to statically balance the Y-shaped plate about a plane intersecting its legs.

9. A unidirectional drive assembly as defined in claim 7 wherein said limit stops comprise opposite sides of an aperture defined in the front plate of said frame assembly, said stop member being freely movable in said aperture between said limit stops.

10. A unidirectional drive assembly as defined in claim 7 wherein said Y-shaped plate is substantially perpendicular to said axis of rotation of said solid shaft, and the stop member is positioned on the trunk leg of said Y-shaped plate to statically counterbalance the first and second idler gears and the idler assembly relative to said axis of rotation.

11. A unidirectional drive assembly as defined in claim 3 wherein said first, second and third idler gears rotate continuously in response to rotation of said ratio gear in either of forward or reverse direction, thereby to provide a substantially constant mechanical load on the register drive gear of a meter on which the unidirectional drive assembly is mounted regardless of the direction of rotation of such a register drive gear.

12. A unidirectional drive assembly as defined in claim 11 in combination with a pawl pivotally mounted on said frame assembly and arranged to engage the teeth of said indicator drive gear or a gear directly coupled therewith, thereby to prevent reverse rotation of said indicator drive gear while allowing forward rotation thereof.

13. A unidirectional drive assembly as defined in claim 11 wherein said indicator is a dial pointer mounted on one end of a rotatably shaft journalled for rotation on said frame assembly and driven by said indicator drive gear mounted in fixed relationship on the other end of said rotatable shaft, and wherein said rotatable shaft is provided with a set of pawl-engaging gear teeth immediately adjacent to a plate member of said frame assembly on which said pawl is pivotally supported, thereby to enable the pawl to prevent the introduction of backlash-inducing spacing between the respective gears of said gear assemblies due to attempted reverse rotation of said dial pointer.

14. A unidirectional drive assembly as defined in claim 3 wherein the ends of said solid shaft and said hollow shaft, respectively, in engagement with said front plate and said back plate of the frame assembly are formed to have cylindrically shaped bearing surfaces with diameters that are in the range of three-quarters to one-half the size of the diameters of the bearing surfaces of said solid shaft nested within and engaging said hollow shaft.

* * * * *